United States Patent
Moens et al.

(10) Patent No.: US 9,929,261 B2
(45) Date of Patent: Mar. 27, 2018

(54) ELECTRONIC DEVICE INCLUDING A HEMT WITH A SEGMENTED GATE ELECTRODE

(71) Applicant: SEMICONDUCTOR COMPONENTS INDUSTRIES, LLC, Phoenix, AZ (US)

(72) Inventors: Peter Moens, Zottegem (BE); Jaume Roig-Guitart, Oudenaarde (BE); Marnix Tack, Merelbeke (BE); Johan Camiel Julia Janssens, Asse (BE)

(73) Assignee: SEMICONDUCTOR COMPONENTS INDUSTRIES, LLC, Phoenix, AZ (US)

( * ) Notice: Subject to any disclaimer, the term of this patent is extended or adjusted under 35 U.S.C. 154(b) by 0 days.

(21) Appl. No.: 15/092,858

(22) Filed: Apr. 7, 2016

(65) Prior Publication Data
US 2017/0294530 A1 Oct. 12, 2017

(51) Int. Cl.
*H01L 27/088* (2006.01)
*H01L 29/778* (2006.01)
*H01L 29/40* (2006.01)
*H01L 29/417* (2006.01)
*H01L 29/423* (2006.01)
*H01L 29/66* (2006.01)
(Continued)

(52) U.S. Cl.
CPC ........ *H01L 29/7786* (2013.01); *H01L 23/482* (2013.01); *H01L 27/0883* (2013.01); *H01L 29/402* (2013.01); *H01L 29/41758* (2013.01); *H01L 29/4238* (2013.01); *H01L 29/66462* (2013.01); *H01L 29/2003* (2013.01); *H01L 29/518* (2013.01)

(58) Field of Classification Search
CPC .................. H01L 27/0883; H01L 21/8236
See application file for complete search history.

(56) References Cited

U.S. PATENT DOCUMENTS 8,264,003 B2 * 9/2012 Herman .............. H01L 27/0605
257/194
2004/0124435 A1 7/2004 D'Evelyn et al.
(Continued)

OTHER PUBLICATIONS

Lu, Bin et al, "High-Performance Integrated Dual-Gate AlGaN/GaN Enhancement-Mode Transistor," IEEE Electron Device Letters, vol. 31, No. 9, dated Sep. 2010, pp. 990-992.

*Primary Examiner* — Phat X Cao
(74) *Attorney, Agent, or Firm* — Abel Law Group, LLP

(57) ABSTRACT

An electronic device can include a low-side HEMT including a segmented gate electrode; and a high-side HEMT coupled to the low-side HEMT, wherein the low-side and high voltage HEMTs are integrated within a same semiconductor die. In another aspect, an electronic device can include a source electrode; a low-side HEMT; a high-side HEMT coupled to the low-side HEMT; and a resistive element. In an embodiment, the resistive element can be coupled to the source electrode and a gate electrode of the high voltage HEMT, and in another embodiment, the resistive element can be coupled to the source electrode and a drain of the low-side HEMT. A process of forming an electronic device can include forming a channel layer over a substrate; and forming a gate electrode over the channel layer. The gate electrode can be a segmented gate electrode of a HEMT.

16 Claims, 10 Drawing Sheets

(51) Int. Cl.
*H01L 23/482* (2006.01)
*H01L 29/20* (2006.01)
*H01L 29/51* (2006.01)

(56) References Cited

U.S. PATENT DOCUMENTS

| | | |
|---|---|---|
| 2006/0081985 A1 | 4/2006 | Beach et al. |
| 2008/0230784 A1 | 9/2008 | Murphy |
| 2010/0201439 A1 | 8/2010 | Wu et al. |
| 2015/0162321 A1* | 6/2015 | Briere .................. H01L 29/778 257/195 |
| 2016/0104797 A1* | 4/2016 | Poelzl .................. H01L 29/407 257/331 |
| 2016/0248422 A1* | 8/2016 | Curatola .............. H03K 17/161 |
| 2017/0092640 A1* | 3/2017 | Aoki .................... H01L 27/0629 |

* cited by examiner

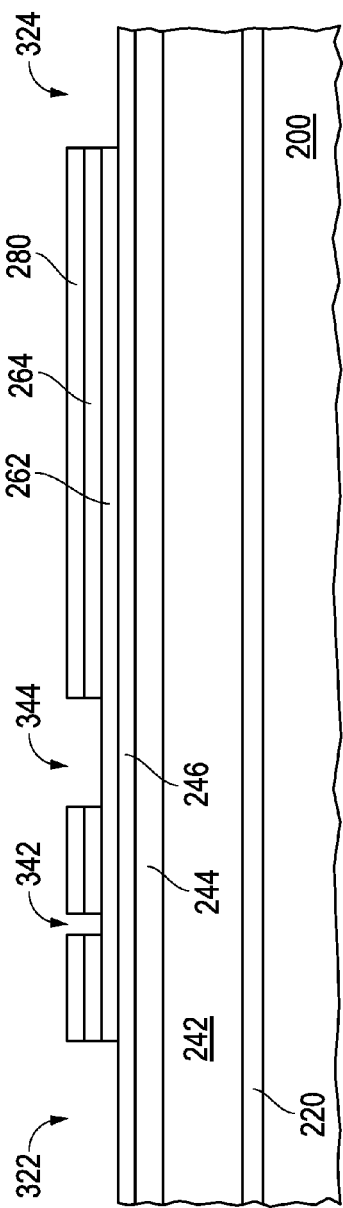 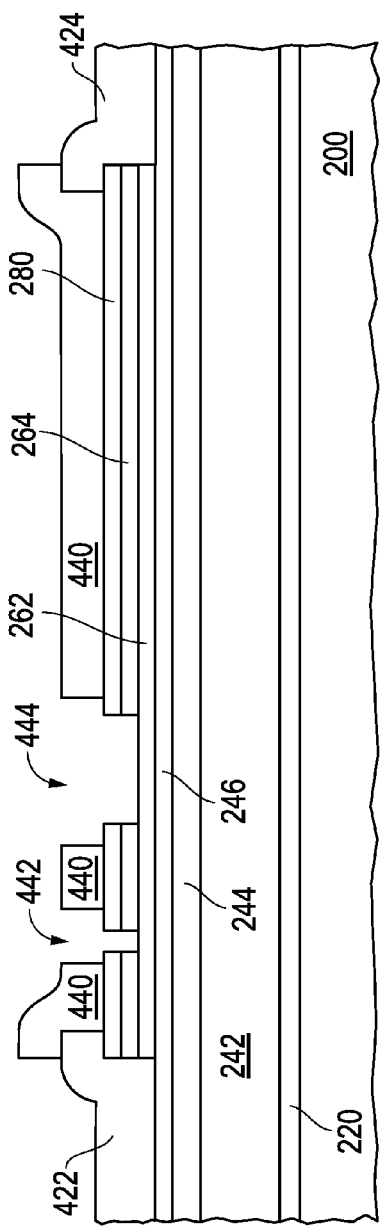
FIG. 3
FIG. 4

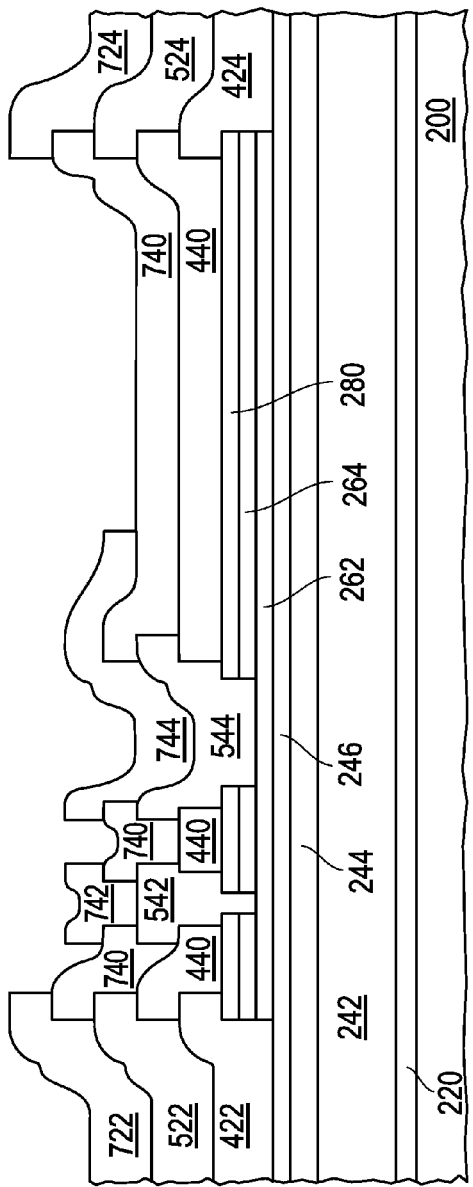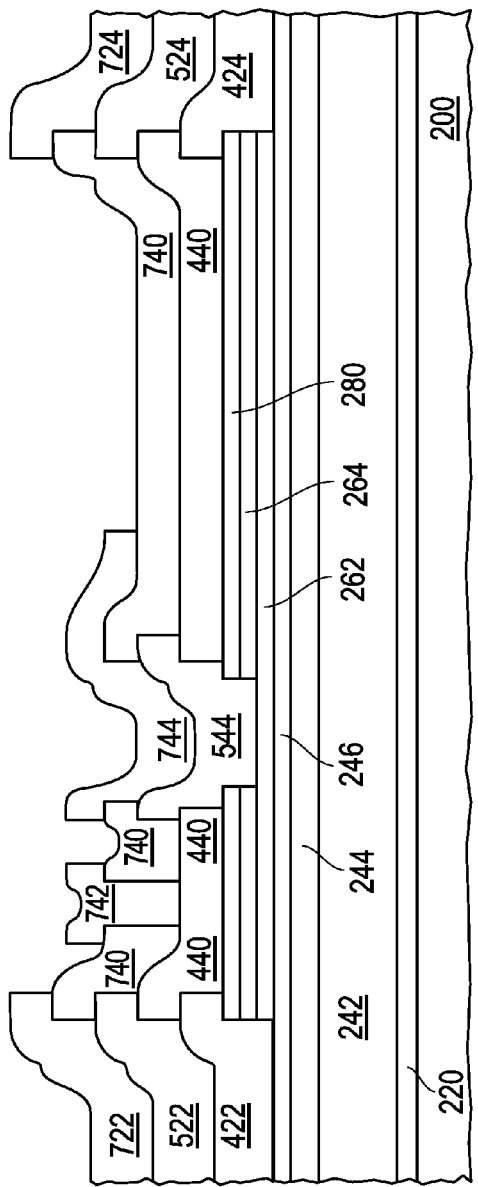

ELECTRONIC DEVICE INCLUDING A HEMT WITH A SEGMENTED GATE ELECTRODE

FIELD OF THE DISCLOSURE

The present disclosure relates to electronic devices, and more particularly to, electronic devices including high-electron mobility transistors including segmented gate electrodes.

RELATED ART

High electron mobility transistors (HEMTs), and GaN transistors in particular, are being used for their ability to carry large amounts of current at relatively high temperatures. A single HEMT can be used but has relatively large gate-to-drain and gate-to source capacitances. An alternative can include a cascode circuit that includes a Si metal-oxide-semiconductor field-effect transistor (MOSFET) and a HEMT, wherein the Si MOSFET includes a switch gate for the circuit. Further improvements in circuits including HEMTs are desired.

BRIEF DESCRIPTION OF THE DRAWINGS

Embodiments are illustrated by way of example and are not limited in the accompanying figures.

FIG. 3 includes an illustration of a cross-sectional view of the workpiece of FIG. 2 after patterning layers to define openings for a source electrode, a drain electrode, and gate electrodes.

FIG. 4 includes an illustration of a cross-sectional view of the workpiece of FIG. 3 after forming source and drain electrodes and a patterned insulating layer.

FIGS. 9 and 10 include illustrations of cross-sectional views of the workpiece of FIG. 8 at sectioning lines 9-9 and 10-10, respectively.

Figure 1:
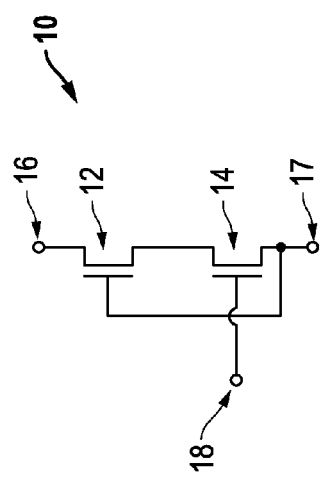
FIG. 1 includes a circuit schematic of a cascode circuit.

Skilled artisans appreciate that elements in the figures are illustrated for simplicity and clarity and have not necessarily been drawn to scale. For example, the dimensions of some of the elements in the figures may be exaggerated relative to other elements to help to improve understanding of embodiments of the invention.

DETAILED DESCRIPTION

The following description in combination with the figures is provided to assist in understanding the teachings disclosed herein. The following discussion will focus on specific implementations and embodiments of the teachings. This focus is provided to assist in describing the teachings and should not be interpreted as a limitation on the scope or applicability of the teachings. However, other embodiments can be used based on the teachings as disclosed in this application.

The term "compound semiconductor" is intended to mean a semiconductor material that includes at least two different elements. Examples include SiC, SiGe, GaN, InP, $Al_yGa_{(1-y)}N$, CdTe, and the like. A III-V semiconductor material is intended to mean a semiconductor material that includes at least one trivalent metal element and at least one Group 15 element. A III-N semiconductor material is intended to mean a semiconductor material that includes at least one trivalent metal element and nitrogen. A Group 13-Group 15 semiconductor material is intended to mean a semiconductor material that includes at least one Group 13 element and at least one Group 15 element.

The term "carrier impurity" is intended to mean (1) when an acceptor, an impurity within a compound having a different valence state as compared to at least 90% of all cations within the compound, or (2) when a donor, an impurity within a compound having a different valence as compared to at least 90% of all anions within the compound. For example, C, Mg, and Si are acceptors with respect to GaN because they can trap electrons. As used herein, Al is not a carrier impurity with respect to GaN because Al and Ga have a 3+ valence. A carrier impurity may be intentionally added or may be present as a naturally occurring impurity or as a consequence of forming a layer that includes the impurity. Acceptors and donors are carrier impurities of opposite carrier types.

Although a layer or a region may be described herein as a donor impurity type or an acceptor impurity type, skilled artisans understand that the impurity types can be reversed and are also possible in accordance with the present description.

Unless stated explicitly to the contrary, the terms "carrier impurity concentration" or "concentration of a carrier impurity", when referring to a layer, a film, or a region, is intended to mean an average concentration for such layer, film, or region.

For clarity of the drawings, certain regions of device structures, such as doped regions or dielectric regions, may be illustrated as having generally straight line edges and precise angular corners. However, those skilled in the art understand that, due to the diffusion and activation of dopants or formation of layers, the edges of such regions generally may not be straight lines and that the corners may not be precise angles.

The terms "on," "overlying," and "over" may be used to indicate that two or more elements are in direct physical contact with each other. However, "over" may also mean that two or more elements are not in direct contact with each other. For example, "over" may mean that one element is above another element but the elements do not contact each other and may have another element or elements in between the two elements.

Group numbers corresponding to columns within the Periodic Table of Elements based on the IUPAC Periodic Table of Elements, version dated Jan. 21, 2011.

The term "normal operation" and "normal operating state" refer to conditions under which an electronic component or device is designed to operate. The conditions may be obtained from a data sheet or other information regarding voltages, currents, capacitances, resistances, or other electrical parameters. Thus, normal operation does not include operating an electrical component or device well beyond its design limits.

The term "high voltage," with reference to a layer, a structure, or a device, means that such layer, structure, or device can withstand at least 150 V difference across such layer, structure, or device (e.g., between a source and a drain of a transistor when in an off-state) without exhibiting dielectric breakdown, avalanche breakdown, or the like.

The terms "comprises," "comprising," "includes," "including," "has," "having" or any other variation thereof, are intended to cover a non-exclusive inclusion. For example, a method, article, or apparatus that comprises a list of features is not necessarily limited only to those features but may include other features not expressly listed or inherent to such method, article, or apparatus. Further, unless expressly stated to the contrary, "or" refers to an inclusive- or and not to an exclusive- or. For example, a condition A or B is satisfied by any one of the following: A is true (or present) and B is false (or not present), A is false (or not present) and B is true (or present), and both A and B are true (or present).

Also, the use of "a" or "an" is employed to describe elements and components described herein. This is done merely for convenience and to give a general sense of the scope of the invention. This description should be read to include one, at least one, or the singular as also including the plural, or vice versa, unless it is clear that it is meant otherwise. For example, when a single item is described herein, more than one item may be used in place of a single item. Similarly, where more than one item is described herein, a single item may be substituted for that more than one item.

The use of the word "about", "approximately", or "substantially" is intended to mean that a value of a parameter is close to a stated value or position. However, minor differences may prevent the values or positions from being exactly as stated. Thus, differences of up to ten percent (10%) (and up to twenty percent (20%) for semiconductor doping concentrations) for the value are reasonable differences from the ideal goal of exactly as described.

Unless otherwise defined, all technical and scientific terms used herein have the same meaning as commonly understood by one of ordinary skill in the art to which this invention belongs. The materials, methods, and examples are illustrative only and not intended to be limiting. To the extent not described herein, many details regarding specific materials and processing acts are conventional and may be found in textbooks and other sources within the semiconductor and electronic arts.

An electronic device can include a low-side HEMT including a segmented gate electrode; and a high-side HEMT coupled to the low-side HEMT and including a gate electrode, wherein the low-side and high voltage HEMTs are integrated within a same die. In another aspect, an electronic device can include a source; a low-side HEMT; a high-side HEMT coupled to the low-side HEMT and including a gate; and a resistive element having a first terminal coupled to the source, and the second terminal coupled to the gate of the high-side HEMT.

A process of forming an electronic device can include forming a channel film over a substrate, wherein the channel film includes a III-V material; forming a first dielectric film over the channel film; and forming a first gate electrode and a second gate electrode over the first dielectric film. The first gate electrode can be a segmented gate electrode of a low-side HEMT, and the second gate electrode can be a gate electrode of a high-side HEMT.

The segmented gate electrode of the embodiments described herein can allow for a faster operating electronic device and more flexibility with the design of the cascode circuit and electronic device. The segmented gate electrode can have a lower gate capacitance as compared to a gate electrode that is not segmented. The lower gate capacitance can allow for a faster switching speed for the circuit. The spacing between the gate members 542 of the segmented gate electrode can be adjusted depending on whether a resistive element is to be incorporated within the structure, and if so, the amount of impedance that the resistive element will have.

In a particular embodiment, the low-side and high-side HEMTs can be integrated within the same die. Thus, the parasitic characteristics, such as parasitic inductance, associated with wires for a cascode circuit including a Si MOSFET and a HEMT are obviated. As compared to a single HEMT (without the low-side HEMT) has significantly higher capacitances as compared to the low-side HEMT that can be used for a switching transistor, as the low-side HEMT can operate with gate voltages in a range of approximately 5 V to approximately 20 V.

The concepts and design considerations are better understood after reading the embodiments that follow. Much of the description below will address GaN as the material of the channel layer as a specific example in order to simplify understanding of the concepts and design considerations. Clearly, embodiments of the present invention are not limited to a GaN channel layer. After reading the specification in its entirety, skilled artisans will appreciate that the embodiments are merely for illustrative purposes and do not limit scope of the appended claims.

FIG. 1 includes a schematic of a cascode circuit 10 that includes a high-side transistor 12 and a low-side transistor 14. A drain of the transistor 12 is coupled to a relatively high-side power supply terminal 16, a source of the transistor 12 is coupled to a drain of the transistor 14, and a gate of the transistor 12 is coupled to a source of the transistor 14 and a relatively low-side power supply terminal 17. In a particular embodiment, the relatively low-side power supply terminal 17 may be at 0 V. A gate of the transistor 14 is coupled to a control terminal 18. In the embodiment as illustrated in FIG. 1, the low-side transistor 14 is a switching transistor for the cascode circuit 10. The transistor 12, 14, or each of transistors 12 and 14 can be a high electron mobility transistor (HEMT). As illustrated in the embodiment of FIG. 1, the transistors 12 and 14 are HEMTs. In a particular embodiment, each of the transistors is a depletion-mode transistor. In an alternative embodiment, the transistor 14 can be an enhancement-mode transistor. The transistor 14 can include a segmented gate electrode, regardless whether the transistor 14 is a depletion-mode or enhancement mode transistor.

An electronic device can incorporate the HEMTs 12 and 14 of the cascode circuit 10 within a single die. The description and FIGS. 2 to 11 include non-limiting physical embodiments of the cascode circuit 10.

Figure 2:
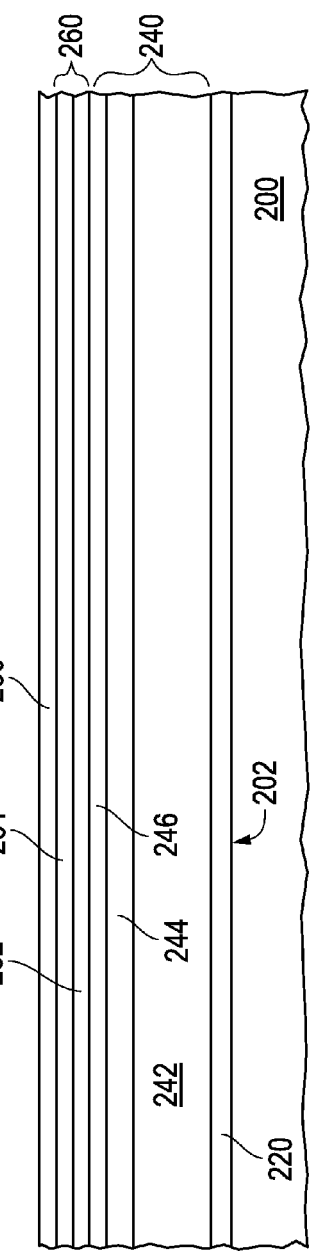
FIG. 2 includes an illustration of a cross-sectional view of a portion of a workpiece including a substrate, a nucleation layer, a semiconductor layer, and a gate dielectric layer.

FIG. 2 includes an illustration of a cross-sectional view of a portion of a workpiece that includes a substrate 200, a nucleation layer 220, a semiconductor layer 240, a gate dielectric layer 260, and a capping layer 280. The substrate 200 has a primary surface 202 and can include silicon, sapphire (monocrystalline $Al_2O_3$), silicon carbide (SiC), aluminum nitride (AlN), gallium oxide ($Ga_2O_3$), spinel ($MgAl_2O_4$), Gallium Nitride (GaN), another suitable substantially monocrystalline material, or the like. The selection of the particular material and crystal orientation along the primary surface 202 can be selected depending upon the composition of the semiconductor layer 240 that will be subsequently formed over the substrate 200. The nucleation layer 220 can help to epitaxially grow the semiconductor layer 240. In an embodiment, the nucleation layer 220 may include one or more elements that are common to the subsequently formed semiconductor layer 240. In a particular embodiment, the nucleation layer can include aluminum nitride when an aluminum-containing semiconductor layer 240 is being formed over the nucleation layer 220. The thickness of the nucleating layer can be in a range of 20 nm to 1000 nm.

The semiconductor layer 240 can include a buffer film 242, a channel film 244, and a barrier film 246. The composition of the buffer film 242 may depend on the composition of the channel film 244. In an embodiment, the channel film 244 includes GaN, and the buffer film 242 includes AlGaN. The composition of the buffer film 242 can be changed as a function of thickness, such that the buffer film 242 has a relatively greater aluminum content closer to the nucleation layer 220 and relatively greater gallium content closer to the channel film 244. In a particular embodiment, the cation (metal atoms) content in the buffer film 242 near the nucleation layer 220 can be 10% to 100% Al with the remainder Ga, and the cation content in the buffer film 242 near the channel film 244 can be 0% to 50% Al with the remainder Ga. The thickness of the buffer film 242 may depend on the designed drain-to-source voltage ($V_{DS}$) of the cascode circuit. In an embodiment, the buffer film 242 has a thickness in a range of approximately 1 micron to 5 microns. The buffer film 242 may be thicker than 5 microns, if the electronic device is designed to operate at very high voltages.

The channel film 244 can include a III-V semiconductor material, and in an embodiment, can be a III-N material. In a particular embodiment, the channel film 244 includes monocrystalline GaN. The channel film 244 can have a thickness in a range of approximately 20 nm to 4000 nm. The barrier film 246 can be used to help reduce the likelihood of migration of contaminants or other materials between one or more films underlying the barrier film 246 and gate dielectric layer 260. In a particular embodiment, the barrier film 246 can include AlGaN, wherein the cation content is 5% to 30% aluminum with the remainder gallium. The barrier film 246 can have a thickness in a range of approximately 2 to 30 nm. In another embodiment, a thin spacer layer is present between barrier layer 246 and the channel layer 244. The spacer layer is between 0.5 nm and 2 nm. The Al content of the spacer layer is between 80 mol % and 100 mol %.

The semiconductor layer 240 is formed using an epitaxial growth technique. In a particular embodiment, metal-containing films can be formed using metalorganic chemical vapor deposition. In another embodiment, different composition for the semiconductor layer 240 may be used, e.g., InAlGaN, InP, or the like.

The gate dielectric layer 260 can include a wide bandgap, high dielectric constant ("high k") material that is lattice matched to silicon nitride. The high k value can provide a high electrical field across the gate dielectric layer 260 and allow for a higher gate overdrive. The high k material has a similar or as good quality as an $Al_2O_3$ formed by atomic layer deposition. Such high k material also has a high etch selectivity to silicon nitride, so it can additionally function as an etch stop when etching an overlying layer that includes silicon nitride. Thus, the high k material assists in increasing etch reproducibility and repeatability to improve the manufacturability of the device and also improving the performance of transistor being formed. In the embodiment as illustrated in FIG. 2, the gate dielectric layer 260 can include a silicon nitride film 262 and an AlN film 264. The silicon nitride film 262 can have a thickness and a range of approximately 5 nm to 60 nm, and the AlN nitride film 264 can have a thickness in a range of approximately 2 nm to 20 nm. In another embodiment, the gate dielectric layer 260 can include fewer or more films that may have the same or different compositions as described. The gate dielectric layer 260 has nitride-nitride bonding between the films 262 and 264 that reduces formation of interface states at the silicon nitride/AlN interface that can improve dispersion/current collapse related phenomena. An optional $Al_2O_3$ film (not illustrated) can be formed by oxidizing a portion of the AlN film 264 in an oxidizing ambient, such as $O_2$, $N_2O$, or the like.

The capping layer 280 can be used to protect the gate dielectric layer 260. The capping layer 280 can include silicon nitride and have a thickness in a range of approximately 20 nm to 500 nm. The gate dielectric layer 260 and the capping layer 280 can be formed using a chemical or physical vapor technique.

In an embodiment, the nucleating layer 220, the semiconductor layer 240, the gate dielectric layer 260, and the capping layer 280 are formed without exposing the workpiece to air or another oxygen-containing gas. Thus, the layers and films can be formed without an oxide at an interface between any of the layers and films. In another embodiment, the workpiece may be exposed to air between forming any one or more of the films or layers. If an interfacial oxide is not to remain in the finished device, the interfacial oxide may be reduced in a reducing ambient or etched, for example, back sputtering, to remove the interfacial oxide before forming the subsequent layer or film. In still another embodiment, an oxide film may be formed and remain. For example, after forming the gate dielectric layer 260, the workpiece may be exposed to air before forming the capping layer 280.

FIG. 3 includes a cross-sectional view of the workpiece after patterning layers to define a source electrode opening 322, a drain electrode opening 324, a gate electrode opening 342, and a gate electrode opening 344. Other openings for the subsequently-formed source electrode, drain electrode, and gate electrodes may be formed but are not illustrated in FIG. 3. The source electrode opening 322 and the drain electrode opening 324 extend through the capping layer 280 and the gate dielectric layer 260, and the barrier film 246 is exposed along the bottoms of the source and drain electrode openings 322 and 324. The gate electrode openings 342 and 344 extend through the capping layer 280 and the AlN film 264 of the gate dielectric layer 260, and the silicon nitride film 262 of the gate dielectric layer 260 is exposed along the bottoms of the gate electrode openings 342 and 344. The source and drain electrode openings 322 and 324 can be defined at the same time, and the gate electrode openings 342 and 344 can be defined at the same time. The source and drain electrode openings 322 and 324 can be defined before the gate electrode openings 342 and 344, or vice versa. Furthermore, other operations, such as forming the source and drain electrodes, may be performed before defining the gate electrode openings 342 and 344. After reading this specification, skilled artisans will be able to determine a process integration scheme that meets the needs or desires for a particular application.

FIG. 4 includes a cross-sectional view of the workpiece after forming a source electrode 422, a drain electrode 424, and a patterned insulating layer 440. A conductive layer is deposited over the workpiece and within the source and drain electrode openings 322 and 324. The conductive layer can include one or more films of conductive material. The conductive layer is at least 50 wt % aluminum, copper, a noble metal, or an alloy of any of the foregoing. The conductive layer is patterned to form the source electrode 422 within the source electrode opening 322, the drain electrode 424 within the drain electrode opening 324.

A patterned insulating layer 440 is formed that defines a gate electrode opening 442 for the low-side HEMT, a gate electrode opening 444 for the high-side HEMT, and openings that expose portions of the source and drain electrodes 422 and 424. The patterned insulating layer 440 can include one or more films of oxide, nitride, or oxynitride, and in a particular embodiment is a silicon nitride film. The patterned insulating layer 440 has a thickness in a range of 0.1 microns to 4 microns.

Other gate electrode openings are formed in addition to the gate electrode opening 442 illustrated in FIG. 4. A set of the gate electrode openings help to form a segmented gate electrode for the low-side HEMT 14. The gate electrode opening 444 defines the shape of a gate electrode for the high-side HEMT 12. Other gate electrode openings, substantially identical to the gate electrode opening 444, are also formed. Openings that expose the source and drain electrodes 422 and 424 allow electrical connections to be made to subsequent-formed interconnects.

Figure 5:
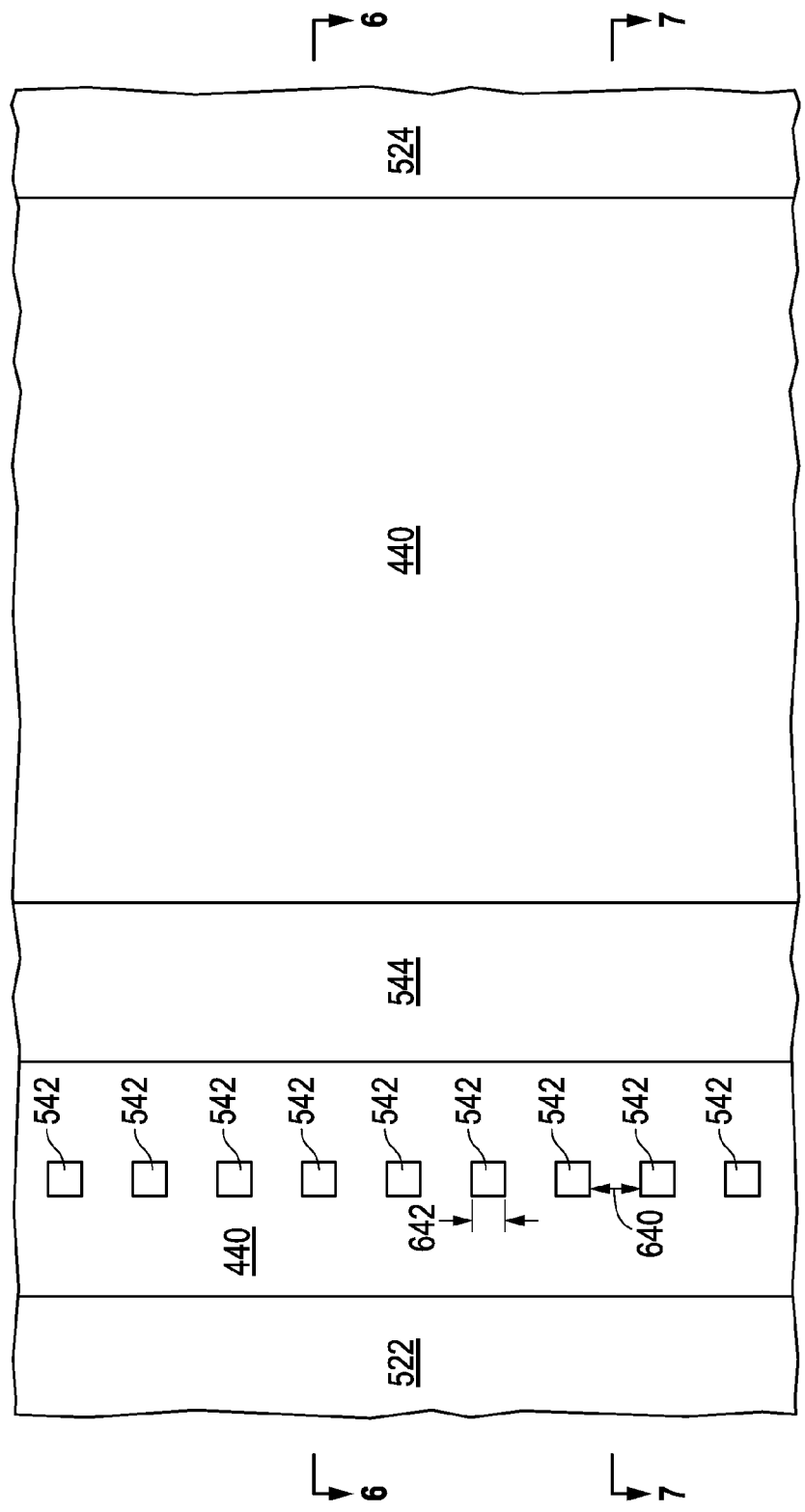
FIG. 5 includes an illustration of a top view of the workpiece of FIG. 4 after forming gate electrodes and interconnects over the source and drain electrodes.
Figure 6:
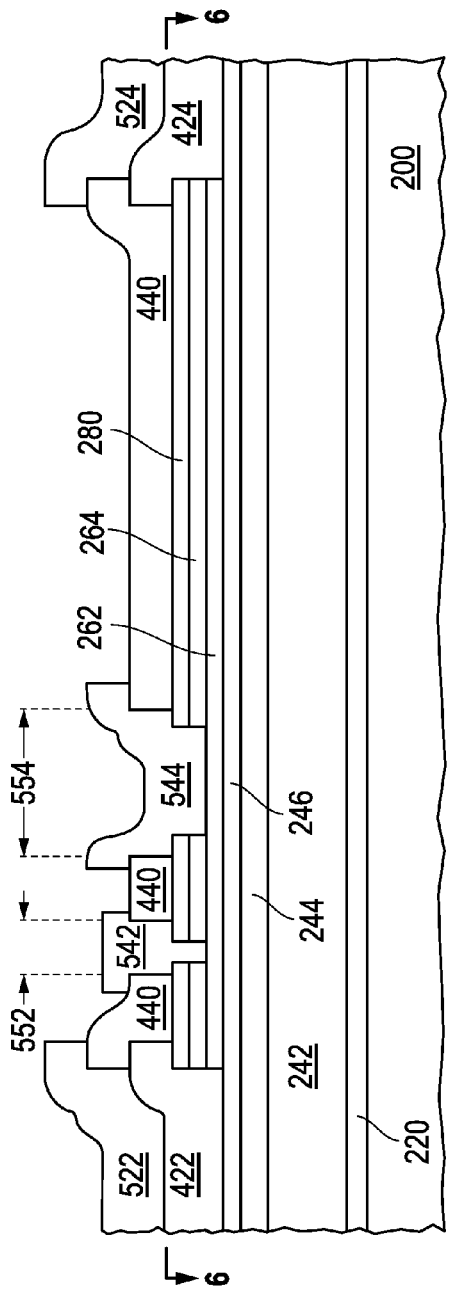
FIGS. 6 and 7 include illustrations of cross-sectional views of the workpiece of FIG. 5 at sectioning lines 6-6 and 7-7, respectively.
Figure 7:
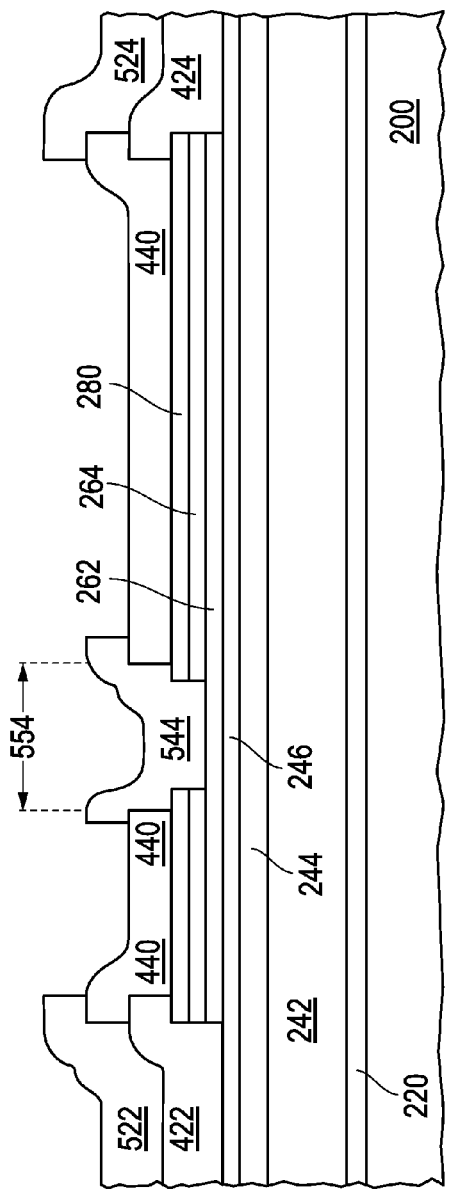

FIGS. 5 to 7 include top and cross-sectional views of the workpiece after forming interconnects 522 and 524, gate members 542 of a gate electrode for the low-side HEMT, and a gate electrode 544 for the high-side HEMT. The interconnects 522 and 524 are connected to the source and drain electrodes 422 and 424, respectively. FIG. 6 includes a cross-sectional view through a gate member 542 at sectioning line 6-6 in FIG. 5, and FIG. 7 includes a cross-sectional view at along a plane between gate members 542 at sectioning line 7-7 in FIG. 5.

The gate electrode for the low-side HEMT allows the cascode circuit to be switched faster as compared to circuit that only includes a single high-side HEMT (without a switching transistor). The gate members 542 and gate electrode 544 have widths 552 and 554 that correspond to the widths of the gate electrode openings 442 and 444 within the insulating layer 440. The gate members 542 can have a width that is at most 0.5 micron or at most 0.4 micron. In a particular embodiment, the gate members 542 have widths in a range of 0.02 micron to 0.3 micron.

The gate electrode 544 has a length that is sufficient to block current when the high-side HEMT is in an off-state. The length 554 may depend on the designed $V_{DS}$ for the cascode circuit. For a designed $V_{DS}$ in a range of 300 V to 700 V, the length 554 can be at least 0.8 micron or at least 1.0 microns. The gate-to-drain capacitance ($C_{GD}$) may too large when the length 554 is too wide. In a particular embodiment, the length 554 can be in a range of 1.0 micron to 3.0 microns. The length 554 can be wider than 3.0 microns as $V_{DS}$ is increased. The gate electrode 544 also includes a portion that extends over the insulating layer 440 towards the drain electrode 424 to help with shielding.

The interconnects 522 and 524 and the gate members 542 and gate electrode 544 can be formed from a conductive layer than may include one or more films. In an embodiment, a conductive layer includes a conductive film that is closer to the semiconductor layer 240 as compared to any other conductive film in the conductive layer. The conductive film has a composition selected to provide a proper work function for the transistors being formed. The conductive film can include Ti, TiN, Al, Pd, Pt, W, Au, Ni, or a stack of any combination thereof and has a thickness in a range of 50 nm to 500 nm. The conductive layer can further include another conductive film that is more conductive than the conductive film closer to the semiconductor layer 240. This other conductive film can include at least 50 wt % aluminum, copper, a noble metal, or an alloy of any of the foregoing.

As illustrated in FIG. 5, the gate for the low-side HEMT includes a segmented gate electrode including the gate members 542. The gate members 542 have dimensions 642 that are measured perpendicular to current flow through the low-side HEMT and are spaced apart from each other by a space 640. Although the gate members 542 are illustrated as having the same shape, dimensions, and spacing between each pair, one or more of the gate members 542 may have a dimension 642 that may be different from other gate members 542, and the spacings 640 between each pair of gate members 542 may not all be the same. The significance of the segmented gate electrode will be discussed later in this specification.

Figure 8:
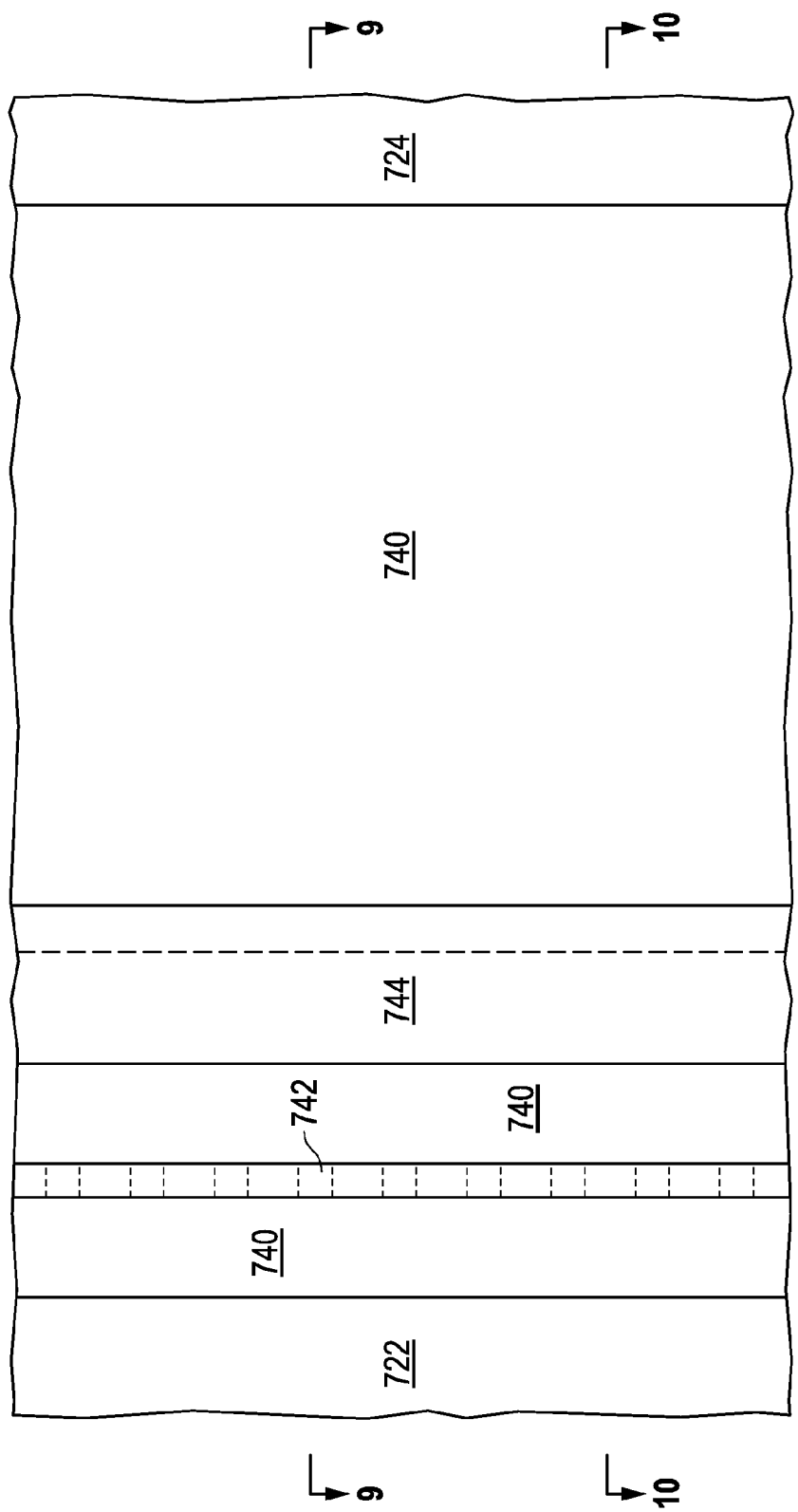
FIG. 8 includes an illustration of a top view of the workpiece of FIGS. 5 to 7 after forming a patterned inter-level dielectric layer and interconnects over the source, drain, and gate electrodes.

FIGS. 8 to 10 include top and cross-sectional views after forming a patterned interlevel dielectric (ILD) layer 740 and interconnects 722, 724, 742, and 744. FIG. 9 includes a cross-sectional view through a gate member 542 at sectioning line 9-9 in FIG. 8, and FIG. 10 includes a cross-sectional view at along a plane between gate members 542 at sectioning line 10-10 in FIG. 8. In FIG. 8 portions of the gate members 542 that underlie the interconnect 742 are illustrated with dashed lines. The gate electrode 544 underlies the interconnect 744, and the right-hand edge of the gate electrode 544 is illustrated with the dashed line within the interconnect 744.

The interconnects 722 and 724 are connected to the source and drain electrodes 422 and 424, respectively. The interconnect 742 is electrically connected the gate electrodes 542 of the segmented gate electrode of the low-side HEMT 14. In another embodiment, a different configuration can be used to connect the gate members 542 of the segmented gate electrode for the low-side HEMT. The interconnect 744 is electrically connected to the gate electrode 544 and includes a portion that extends over the insulating layer 740 further towards the drain electrode 424, as compared to the gate electrode 544, where such portion helps with shielding.

The patterned ILD layer 740 can include any of the materials as described with respect to the insulating layer 440. The patterned ILD layer 740 can have a different composition as compared to the insulating layer 440. In a particular embodiment, the patterned ILD layer 740 may include more oxide as compared to the insulating layer 440.

Figure 11:
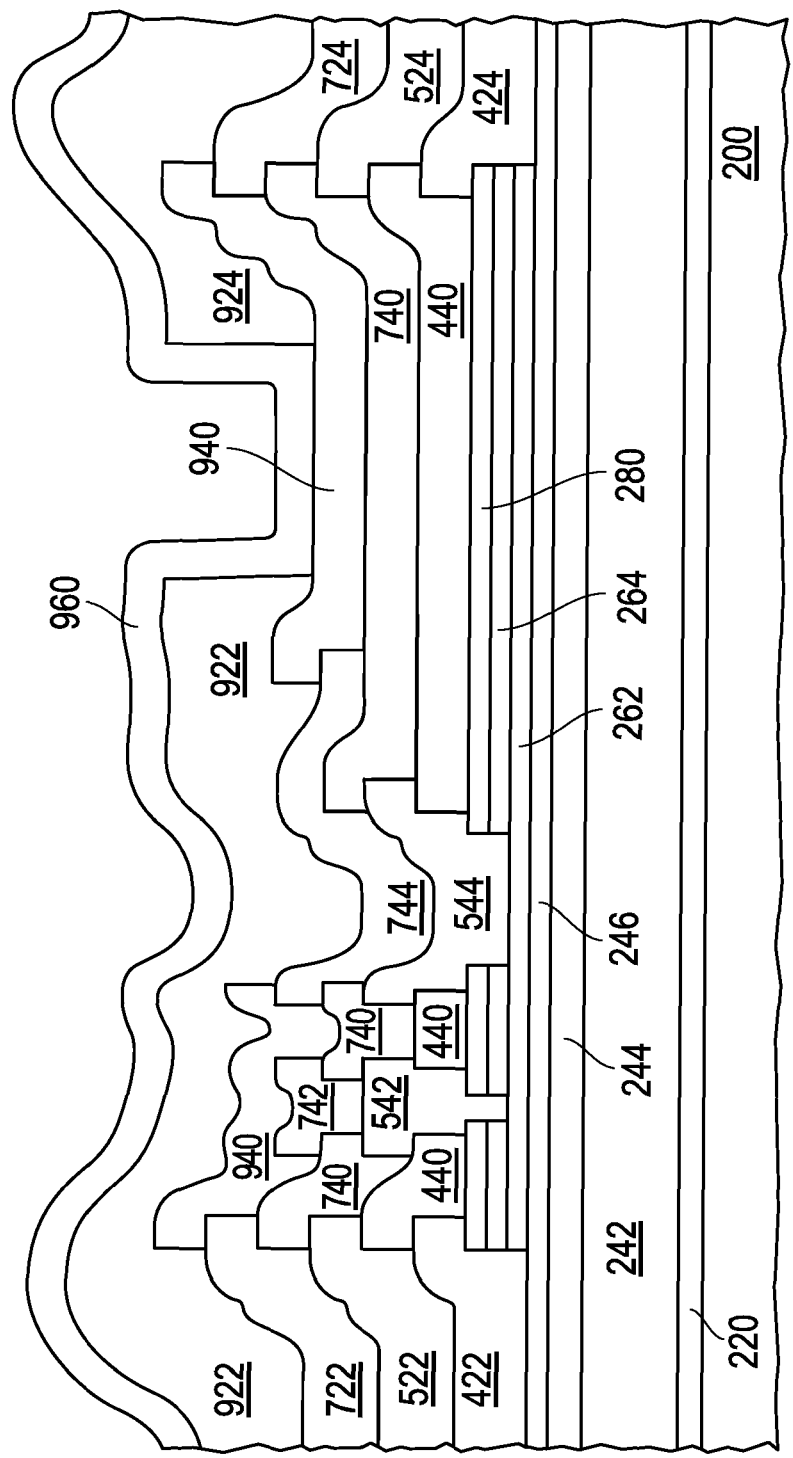
FIG. 11 includes an illustration of a cross-sectional view of the workpiece of FIGS. 8 to 10 after forming a substantially completed electronic device.

FIG. 11 includes an illustration after forming a substantially completed electronic device. A patterned ILD layer 940 is formed and can include any of the materials as described with respect to the insulating layer 440. The patterned ILD layer 940 can have a different composition or the same composition as compared to the insulating layer 440 or the patterned ILD layer 740. In a particular embodiment, the patterned ILD layer 940 may include more oxide as compared to the insulating layer 440. An interconnect 922 is electrically connected to the source electrode 422 and the gate electrode 544 of the high-side HEMT, and is not electrically connected to the gate members 542 of gate electrode for the low-side HEMT. An interconnect 924 is electrically connected to the drain electrode 424. The interconnects 922 and 924 include portions that extend closer to each other to help with shielding. A passivation layer 960 is formed over the patterned ILD layer 940 and the interconnects 922 and 924.

Figure 12:
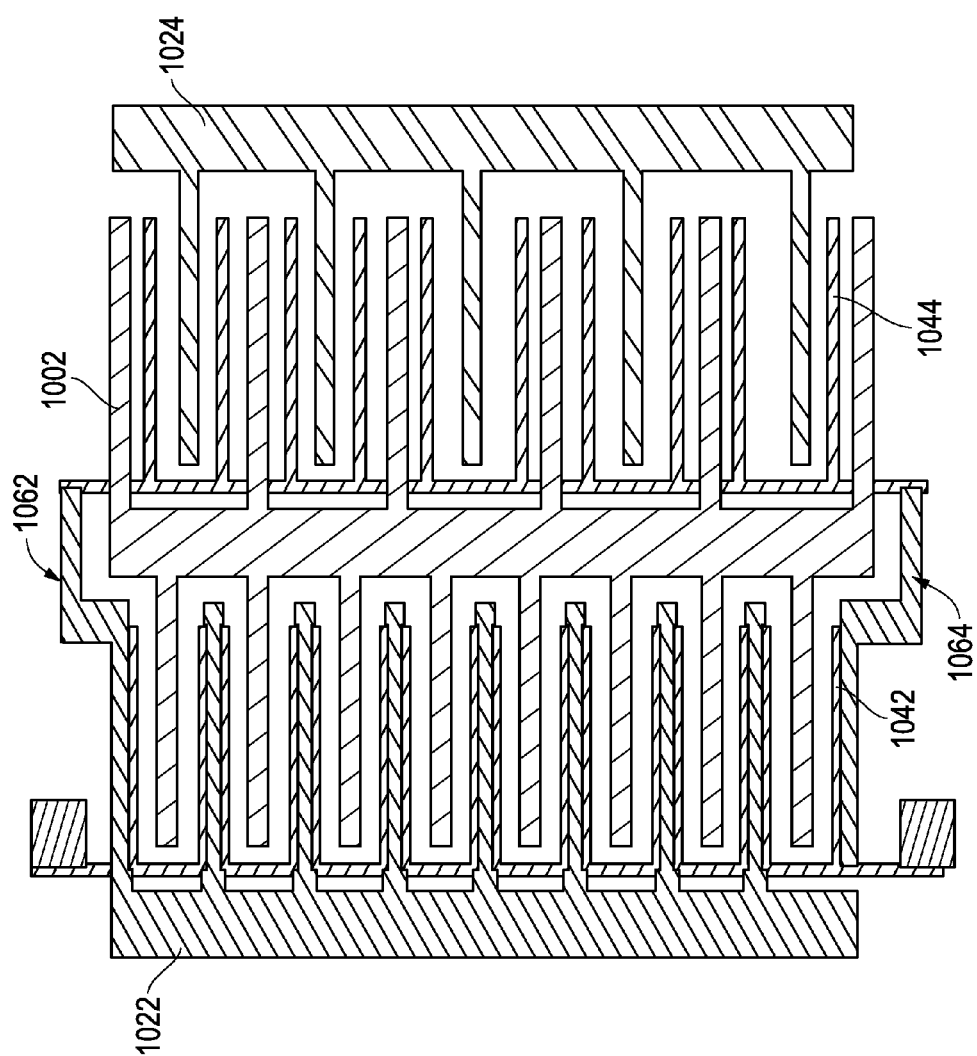
FIG. 12 includes a top view of a physical design of the electronic device in accordance with an embodiment.

FIG. 12 includes a top view of a physical design of a cascode circuit having the low-side and high-side HEMTs within the circuit. The circuit includes a source electrode 1022, a drain electrode 1024, a segmented gate electrode 1042 (not illustration the segmentation to simplify understanding of the physical design) of the low-side HEMT, and the gate electrode 1042 of the high-side HEMT. Portions 1062 and 1064 of the source electrode 1022 are electrically connected to the gate electrode of the high-side HEMT. The source electrode 1022 can be the same or different from the source electrode 422, the drain electrode 1024 can be the same or different from the drain electrode 424, the segmented gate electrode 1042 can be the same or different from the segmented gate electrode of the low-side HEMT, and the gate electrode 1044 can be the same or different from the gate electrode 544 of the high-side HEMT. An interconnect 1002 electrically connects the drain of the low-side HEMT to the source of the high-side HEMT.

As illustrated in FIGS. 6, 7, 9, 10, and 11, the low-side HEMT 14 is a depletion-mode transistor. In another embodiment, the low-side HEMT 14 is an enhancement mode HEMT. The gate electrode opening can be modified such that the bottom of opening extends to the barrier film 246 of the semiconductor layer 260.

Figure 13:
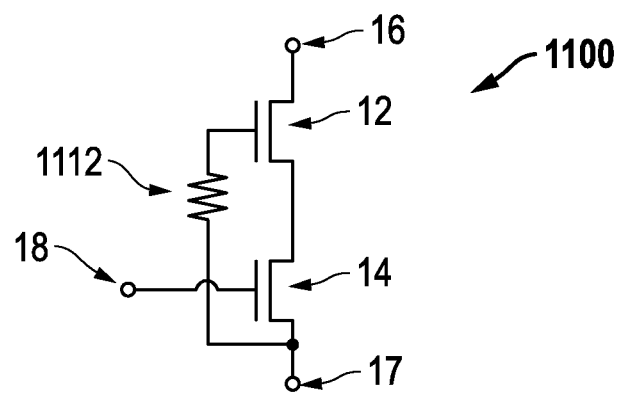
FIG. 13 includes a circuit schematic of a cascode circuit including a resistive element coupled to a source of a low-side transistor and a gate of a high-side transistor.
Figure 14:
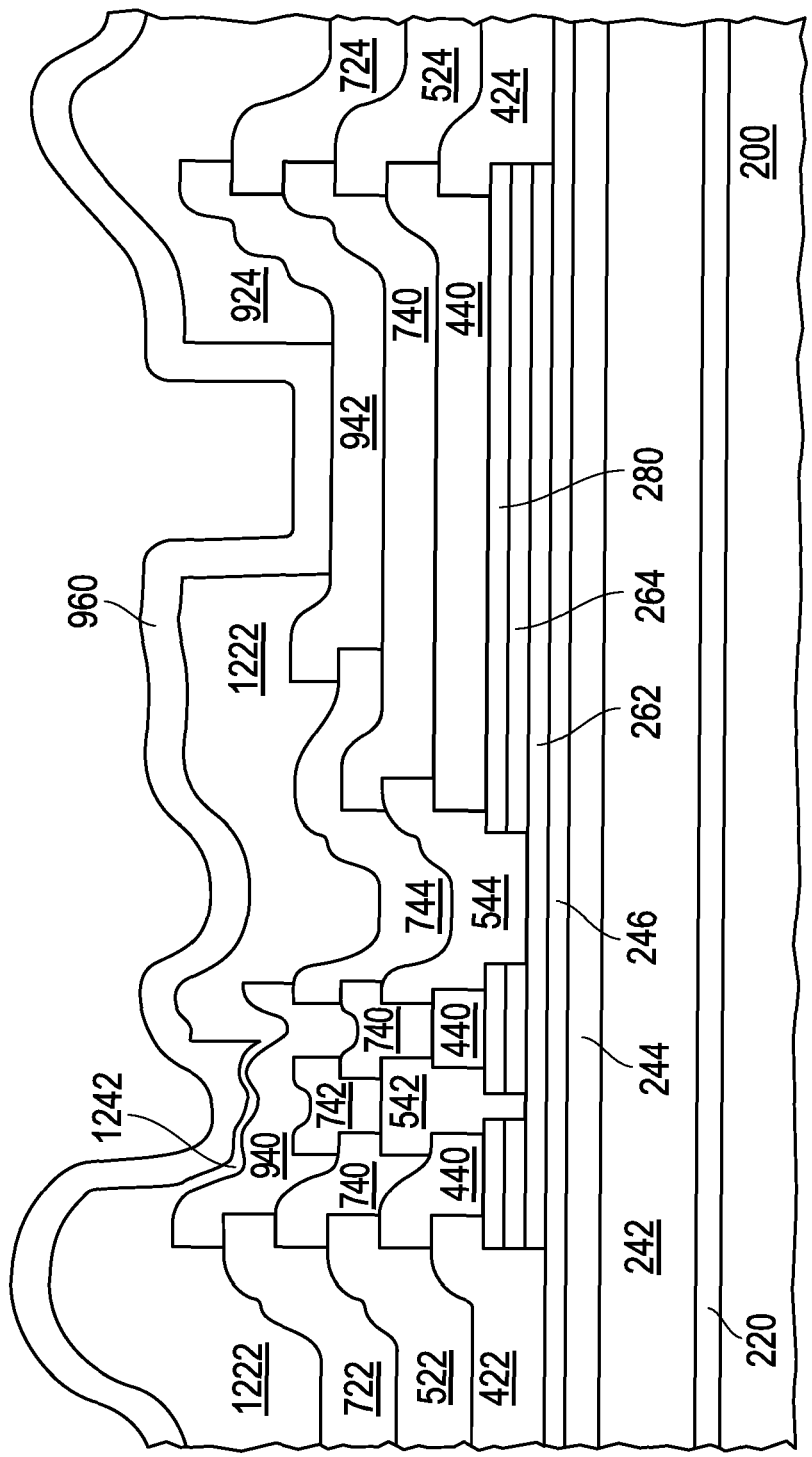
FIG. 14 includes an illustration of a cross-sectional view of a portion of a workpiece including a structure corresponding to the circuit of FIG. 13.

An alternative embodiment can include a resistive element between the source of the low-side HEMT and the gate of the high-side HEMT. FIG. 13 includes a schematic diagram of a cascode circuit 1100 that is similar to the cascode circuit 10 in FIG. 1. FIG. 13 includes a resistive element 1112 that is coupled to the gate of the high-side HEMT 12 and to the source of the low-side HEMT 14. The resistive element 1112 can be obtained in different ways. FIG. 14 includes a particular implementation of the resistive element 1112, wherein an interconnect 1222 is locally thinned to form a portion 1242 that is significantly more resistive than other portions of the interconnect 1222. In a particular embodiment, a conductive layer similar to the interconnects 922 and 924 (FIG. 11) are formed. A portion of the conductive layer is thinned to form the portion 1242. In a particular embodiment, the conductive layer includes a film having relatively thinner refractory metal-containing material and another film that substantially more conductive than the film that has the refractory metal-containing material. The other film can include at least 50% of Al, Ag, or a noble metal that is at least twice as thick as the film having metal-containing material. Thus, the portion 1242 is substantially more resistive than the interconnect 1222, and in a particular embodiment, is more than 20 times more resistive than the interconnect 1222. Referring to FIGS. 12 and 14, the portion 1242 can be located at portion 1042 of the source electrode 1022. In another embodiment, the resistive element can be a resistor that replaces the portion 1242.

Figure 15:
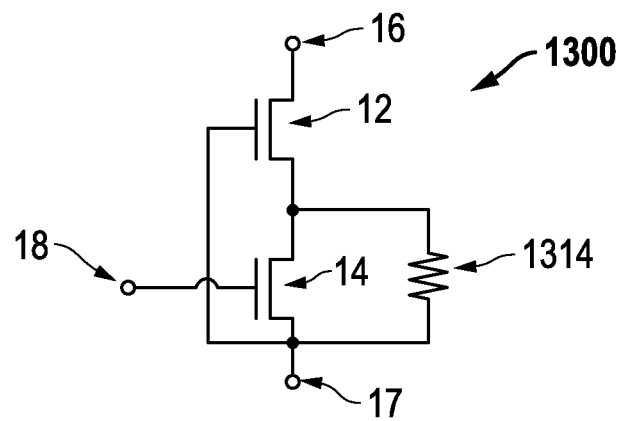
FIG. 15 includes a circuit schematic of a cascode circuit including a resistive element coupled to a source and drain of a low-side transistor.

In a further alternative embodiment, a resistive element 1314 can be coupled to the source and drain of the low-side HEMT 14. More particularly, FIG. 15 includes a schematic diagram of a cascode circuit 1300 that is similar to the cascode circuit 10 in FIG. 1. FIG. 15 includes a resistive element 1314 that is coupled to the source of the low-side HEMT 14 and to the source of the high-side HEMT 14. Referring to FIG. 6, the spacing 640 between members can include a resistive element between the source of the low-side HEMT and the source of the high-side HEMT. When the spacing 640 allows the segmented gate electrode to fully deplete the regions between the gate members 542 of the segmented gate electrode, no resistive element is formed. As the spacing is increased, the regions between the gate members 542 of the segmented gate electrode may not fully deplete, and thus, the resistive element 1314 is formed. The impedance of the resistive element 1314 can be changed by adjusting the spacing between the gate members 542 of the segmented gate electrode. In a further embodiment, another resistive element (not illustrated) can be coupled to the source and drain of the high-side HEMT 12 in addition to the resistive element 1314. In such an embodiment, a voltage divider can be used with the cascode circuit, and may be useful then the mid-node (node at which the source of the high-side HEMT 12 and the drain of the low-side HEMT 14 are electrically connected) is used an output for the cascode circuit.

The segmented gate electrode of the embodiments described herein can allow for a faster electronic device and more flexibility with the design of the cascode circuit and electronic device. The segmented gate electrode can have a lower gate capacitance as compared to a gate electrode that is not segmented. The lower gate capacitance can allow for a faster switching speed for the circuit. The spacing 640 between the gate members 542 of the segmented gate electrode can be adjusted depending on whether a resistive element is to be incorporated within the structure, and if so, the amount of impedance that the resistive element will have.

Embodiments described herein allow for a switching transistor to be integrated on the same die as the high-side HEMT. In a conventional circuit, the switching transistor is a Si metal-oxide-silicon field-effect transitory (MOSFET) that is on a different die as compared to the high-side HEMT. Wires between the different die increase parasitic impendence, for example, parasitic inductance, of the circuit. The integration of the low-side and high-side HEMTs on the same die eliminates the parasitic characteristics related to wires between different dies.

Switching losses can be significantly reduced. As compared to a circuit with a Si MOSFET (for a switching transistor) and a HEMT or to a single HEMT, the low-side and high-side HEMTs as described here can reduce energy loss during a switching operation by almost 50%. In simulations, the cascode HEMT with a Si MOSFET can have an energy loss of 7 µJ for a switching operation, and the single HEMT can have an energy loss of 8 µJ for a switching operation. The low-side and high-side HEMTs as described herein can have an energy loss of 4.3 µJ for a switching operation. Such a loss becomes particularly significant as the operating frequency of the circuit increases. Table 1 below shows the power losses due to switching the circuits at different operating frequencies. The power losses are in units of W and are based on simulations.

TABLE 1

Power losses at different operating frequencies.

| Operating frequency | Si MOSFET + HEMT | Single HEMT | Low-side and High-side HEMTs |
|---|---|---|---|
| 200 kHz | 2.4 | 2.4 | 1.7 |
| 400 kHz | 3.9 | 4.0 | 2.5 |
| 800 kHz | 6.8 | 7.3 | 4.3 |
| 1200 kHz | 9.5 | 10.4 | 5.8 |

Many different aspects and embodiments are possible. Some of those aspects and embodiments are described below. After reading this specification, skilled artisans will appreciate that those aspects and embodiments are only illustrative and do not limit the scope of the present invention. Embodiments may be in accordance with any one or more of the embodiments as listed below.

Embodiment 1 An electronic device including a low-side HEMT including a segmented gate electrode; and a high-side HEMT coupled to the low-side HEMT, wherein the low-side and high voltage HEMTs are integrated within a same die.

Embodiment 2 The electronic device of Embodiment 1, wherein the low-side and high-side HEMTs are part of a cascode circuit.

Embodiment 3 The electronic device of Embodiment 2, wherein the segmented gate electrode of the low-side HEMT is a switch gate of the cascode circuit, and a gate electrode of the high-side HEMT is a control gate of the cascode circuit.

Embodiment 4 The electronic device of Embodiment 1, wherein the low-side HEMT or the high-side HEMT is a depletion-mode HEMT.

Embodiment 5 The electronic device of Embodiment 1, wherein the low-side and the high-side HEMTs are depletion-mode HEMTs.

Embodiment 6 The electronic device of Embodiment 1, wherein the segmented gate electrode includes gate members, and a space between two immediately adjacent gate members is at least 11 nm.

Embodiment 7 The electronic device of Embodiment 1, further including a source electrode and a drain electrode, wherein the source electrode is coupled to the low-side HEMT, and the drain is coupled to the high-side HEMT.

Embodiment 8 The electronic device of Embodiment 7, further including a resistive element having a first terminal and a second terminal, wherein the first terminal is coupled to the source electrode, and the second terminal is coupled to the gate electrode of the high-side HEMT.

Embodiment 9 An electronic device including a source; a low-side HEMT; a high-side HEMT coupled to the low-side HEMT and including a gate; and a resistive element having a first terminal coupled to the source of the low-side HEMT.

Embodiment 10 The electronic device of Embodiment 9, wherein the resistive element further including a second terminal coupled to the gate of the high-side HEMT.

Embodiment 11 The electronic device of Embodiment 9, wherein the resistive element further including a second terminal coupled to the drain of the low-side HEMT Embodiment 12 The electronic device of Embodiment 9, further including a drain coupled to the high-side HEMT, wherein the source is coupled to the low-side HEMT Embodiment 13 The electronic device of Embodiment 9, wherein the resistive element is formed from a thinned portion of an interconnect layer Embodiment 14 A process of forming an electronic device including forming a channel film over a substrate, wherein the channel film includes a III-V material; forming a first dielectric film over the channel film; and forming a first gate electrode and a second gate electrode over the first dielectric film, wherein the first gate electrode is a segmented gate electrode of a low-side HEMT, and the second gate electrode is a gate electrode of a high-side HEMT Embodiment 15 The process of Embodiment 14, further including forming a source electrode over the channel layer, wherein the source electrode is coupled to the low-side HEMT; and forming a drain electrode over the channel layer, wherein the source electrode is coupled to the high-side HEMT.

Embodiment 16 The process of Embodiment 15, further including forming an interconnect layer over the first and second gate electrodes; and patterning a portion of the interconnect layer to define a resistive element from the interconnect layer, wherein the resistive element has a first terminal coupled to the source electrode and a second terminal coupled to the second gate electrode.

Embodiment 17 The process of Embodiment 16, wherein patterning the portion of the interconnect layer includes removing a part of, but not all, of a thickness of the interconnect layer to define the resistive element.

Embodiment 18 The process of Embodiment 17, further including forming a second dielectric layer over the first dielectric film; forming an insulating layer over the second dielectric film; patterning the insulating layer to define openings for the first and second gate electrodes; and patterning the second dielectric film to define openings for the first and second gate electrodes, wherein a step is formed at a transition from the openings of the insulating layer to the openings of the second dielectric layer.

Embodiment 19 The process of Embodiment 18, further including forming an etch-stop layer after forming the second dielectric layer and before forming the insulating, wherein patterning the insulating layer is performed such that the etch-stop layer is exposed along bottoms of the openings of the insulating layer.

Note that not all of the activities described above in the general description or the examples are required, that a portion of a specific activity may not be required, and that one or more further activities may be performed in addition to those described. Still further, the order in which activities are listed is not necessarily the order in which they are performed.

Benefits, other advantages, and solutions to problems have been described above with regard to specific embodiments. However, the benefits, advantages, solutions to problems, and any feature(s) that may cause any benefit, advantage, or solution to occur or become more pronounced are not to be construed as a critical, required, or essential feature of any or all the claims.

The specification and illustrations of the embodiments described herein are intended to provide a general understanding of the structure of the various embodiments. The specification and illustrations are not intended to serve as an exhaustive and comprehensive description of all of the elements and features of apparatus and systems that use the structures or methods described herein. Certain features are, for clarity, described herein in the context of separate embodiments, may also be provided in combination in a single embodiment. Conversely, various features that are, for brevity, described in the context of a single embodiment, may also be provided separately or in any subcombination.

Further, reference to values stated in ranges includes each and every value within that range. Many other embodiments may be apparent to skilled artisans only after reading this specification. Accordingly, the disclosure is to be regarded as illustrative rather than restrictive.

What is claimed is:

1. An electronic device comprising:
    a low-side HEMT including a channel layer and a segmented gate electrode including gate members spaced apart from one another by spacings that do not include any part of the segmented gate electrode; and
    a high-side HEMT coupled to the low-side HEMT; and
    a resistive element that includes portions of the channel layer underlying the spacings between the gate members of the segmented gate electrode,
    wherein the low-side and high-side HEMTs are integrated within a same die.

2. The electronic device of claim 1, wherein the low-side and high-side HEMTs are part of a cascode circuit.

3. The electronic device of claim 2, wherein the segmented gate electrode of the low-side HEMT is a switch gate of the cascode circuit, and a gate electrode of the high-side HEMT is a control gate of the cascode circuit.

4. The electronic device of claim 1, wherein the low-side HEMT or the high-side HEMT is a depletion-mode HEMT.

5. The electronic device of claim 1, wherein the low-side and the high-side HEMTs are depletion-mode HEMTs.

6. The electronic device of claim 1, wherein each of the spacings are at least 11 nm.

7. The electronic device of claim 1, further comprising a source electrode and a drain electrode, wherein the source electrode is coupled to the low-side HEMT, and the drain is coupled to the high-side HEMT.

8. The electronic device of claim 1, further comprising a patterned interlevel dielectric layer and an interconnect that connects the gate members of the segmented gate electrode to one another.

9. An electronic device comprising:
    a low-side HEMT including a source electrode, a channel layer, and a segmented gate electrode including gate members spaced apart from one other by spacings;
    a high-side HEMT coupled to the low-side HEMT and including a gate electrode; and
    a resistive element having a first terminal coupled to the source electrode of the low-side HEMT, wherein the resistive element includes portions of the channel layer underlying the spacings.

10. The electronic device of claim 9, wherein the low-side HEMT comprises a drain electrode, and wherein the resistive element further comprises a second terminal coupled to the drain electrode of the low-side HEMT.

11. The electronic device of claim 9, wherein the high-side HEMT further comprises a drain electrode coupled to the source electrode of the low-side HEMT.

12. The electronic device of claim 9, wherein the gate members include discontinuous portions of a conductive layer.

13. The electronic device of claim 9, wherein the spacings do not include portions of the segmented gate electrode.

14. The electronic device of claim 13, wherein the segmented gate electrode does not overlie the channel layer within the spacings between the gate members.

15. The electronic device of claim 9, wherein the low-side and high-side HEMTs and the resistive element are parts of a same die.

16. The electronic device of claim 9, wherein each of the spacings is at least 11 nm.

* * * * *